(12) United States Patent
Kim et al.

(10) Patent No.: US 9,362,377 B1
(45) Date of Patent: Jun. 7, 2016

(54) LOW LINE RESISTIVITY AND REPEATABLE METAL RECESS USING CVD COBALT REFLOW

(71) Applicant: GLOBALFOUNDRIES Inc., Grand Cayman (KY)

(72) Inventors: Hoon Kim, Clifton Park, NY (US);
Vimal Kamineni, Mechanicsville, NY (US); Min Gyu Sung, Latham, NY (US); Chanro Park, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/633,998

(22) Filed: Feb. 27, 2015

(51) Int. Cl.
*H01L 21/44* (2006.01)
*H01L 23/52* (2006.01)
*H01L 29/49* (2006.01)
*H01L 21/28* (2006.01)
*H01L 21/285* (2006.01)
*H01L 21/321* (2006.01)
*H01L 21/02* (2006.01)
*H01L 21/311* (2006.01)

(52) U.S. Cl.
CPC ...... *H01L 29/4966* (2013.01); *H01L 21/02244* (2013.01); *H01L 21/28088* (2013.01); *H01L 21/28556* (2013.01); *H01L 21/28568* (2013.01); *H01L 21/31111* (2013.01); *H01L 21/3212* (2013.01)

(58) Field of Classification Search
CPC ............ H01L 2924/01029; H01L 2924/01027; H01L 2224/32245; H01L 2224/13147; H01L 2224/05647; H01L 2224/05147; H01L 2224/11849; H01L 2224/13157; H01L 21/76877; H01L 2224/13647; H01L 2224/05006
USPC .................... 438/672, 675, 683, 685, 687; 257/750–753, 762, 768, 774, 775
See application file for complete search history.

(56) References Cited

U.S. PATENT DOCUMENTS 9,018,054 B2 * 4/2015 Yoshida ............ H01L 21/28079
438/163

* cited by examiner

*Primary Examiner* — Hsien Ming Lee
(74) *Attorney, Agent, or Firm* — Ditthavong & Steiner, P.C.

(57) ABSTRACT

Methods for forming a semiconductor gate electrode with a reflowed Co layer and the resulting device are disclosed. Embodiments include forming a trench in an ILD on a substrate; forming a high-k dielectric layer, a WF layer, and a Co layer sequentially on sidewall and bottom surfaces of the trench; reflowing a portion of the Co layer from the WF layer on the sidewall surfaces of the trench to the WF layer on the bottom surface of the trench; removing a remainder of the Co layer from the WF layer on the sidewall surfaces of the trench, above an upper surface of the reflowed Co; recessing the WF layer to the upper surface of the reflowed Co layer, forming a cavity above the reflowed Co layer; and filling the cavity with metal to form a gate electrode.

19 Claims, 3 Drawing Sheets

BACKGROUND

_US 9,362,377 B1_

LOW LINE RESISTIVITY AND REPEATABLE METAL RECESS USING CVD COBALT REFLOW

TECHNICAL FIELD

The present disclosure relates to the manufacture of semiconductor metal gate electrodes. The present disclosure is particularly applicable to the formation of low line resistivity gate electrodes for 7 nanometer (nm) technology node devices and beyond.

BACKGROUND

In a typical semiconductor device, metal gates may be formed in trenches in an interlayer dielectric (ILD) by depositing various layers such as a high-k dielectric layer, work function (WF) layers such as titanium nitride (TiN) and titanium aluminum carbide (TiAlC), a gate metal such as tungsten (W) or aluminum (Al), and a capping layer. However, as semiconductor devices are scaled down, it is difficult to deposit the various layers without narrowing or pinching off the gate, which in turn causes poor fill for an organic planarization layer (OPL) and reactive ion etch (RIE) damage to the WF layers in recess formation in subsequent processing. Also, OPL removal is done by ashing, which causes a threshold voltage (Vt) shift and leakage increase. FIG. 1 illustrates a gate 101 formed in a trench in an ILD (not shown for illustrative convenience), for a 7 nm device. The gate has a 125 nm height (this gate height can be changed) and a 15 nm width, which represents a potential 15 nm opening for depositing the various layers. As shown in this figure, a gate oxide layer 103 is formed on the bottom surface, and then a conformal layer of a high-k dielectric 105 and WF layers of TiN 107, TiAlC 109 and TiN 111 are sequentially deposited on side and bottom surfaces of the trench. However, due to narrowing of the opening during formation of the gate layers, the actual opening for the metal fill may be less than 5 nm. The decreased metal opening size can cause the etching and recessing processes to fail, and increase the likelihood of a gate electrode to contact short.

A need therefore exists for methodology enabling the fabrication of a metal gate without narrowing or pinching off the gate and the resulting device.

SUMMARY

An aspect of the present disclosure relates to methods for forming a semiconductor device with a reflowed Co layer, which allows the deposition of various layers without narrowing or pinching off the gate.

Another aspect of the present disclosure relates to devices with a reflowed Co layer, in which the deposition of various layers for the fabrication of a gate electrode occurs without narrowing or pinching off the gate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method, which includes forming a trench in an ILD on a substrate; forming a high-k dielectric layer and a WF layer sequentially on sidewall and bottom surfaces of the trench; forming a Co layer on the WF layer on the sidewall and bottom surfaces of the trench; reflowing a portion of the Co layer from the WF layer on the sidewall surfaces of the trench to the WF layer on the bottom surface of the trench; removing a remainder of the Co layer from the WF layer on the sidewall surfaces of the trench, above an upper surface of the reflowed Co; recessing the WF layer to the upper surface of the reflowed Co layer, forming a cavity above the reflowed Co layer; and filling the cavity with metal to form a gate electrode.

Aspects of the present disclosure also include forming the Co layer by chemical vapor deposition (CVD). Other aspects include reflowing the Co layer from the WF layer on the sidewall surfaces of the trench to the bottom surface of the trench by heating the Co layer at 200° C. to 600° C. Still other aspects include removing the remainder of the Co layer from the WF layer on the sidewall surfaces of the trench by oxidizing the remainder of the Co layer and removing the oxidized Co layer and any remaining Co of the Co layer on the WF layer on the sidewall surfaces of the trench. Further aspects include removing the oxidized Co layer and remaining Co from the WF layer on the sidewall surfaces of the trench by wet etching. Other aspects include recessing the WF layer to the upper surface of the reflowed Co layer by etching. Still other aspects include filling the cavity with metal to form a gate electrode by forming a TiN barrier layer on sidewall and bottom surfaces of the cavity. Further aspects include filling the cavity with metal to form a gate electrode include depositing a W seed layer on the TiN barrier layer by atomic layer deposition (ALD) and filling a remainder of the cavity with W by CVD. Still further aspects include filling the cavity with metal to form a gate electrode include filling a remainder of the cavity with Co by CVD after forming the TiN barrier layer. Other aspects include forming a gate oxide layer on the bottom surface of the trench prior to forming the high-k dielectric layer. Still other aspects include forming the WF layer of a first layer of TiN and a second layer of titanium aluminum carbide (TiAlC). Further aspects include chemical-mechanical polishing (CMP) the metal after filling the cavity.

According to the present disclosure, some technical effects may be achieved in part by a device, which includes a first trench formed in an ILD; a high-k dielectric layer on top, sidewall and bottom surfaces of the first trench; a WF layer on the high-k dielectric on the bottom surface and a bottom portion of the sidewall surfaces of the first trench, forming a second trench; a Co layer filling the second trench; and a metal filling a remainder of the first trench. Other aspects include a gate oxide layer on the bottom surface of the first trench, under the high-k dielectric layer. Still other aspects include the WF layer including TiN and TiAlC. Further aspects include the metal including a TiN barrier layer on sidewall and bottom surfaces of the remainder of the first trench. Still further aspects include the metal further including W or Co filling the remainder of the first trench. Additional aspects include a TiN barrier layer on side and bottom surfaces of second trench, under the Co layer.

According to the present disclosure, some technical effects may be achieved in part by a method, which includes forming a trench in an ILD on a substrate; forming a high-k dielectric layer and a WF layer sequentially on sidewall and bottom surfaces of the first trench; chemical vapor depositing a Co layer on the WF layer on the sidewall and bottom surfaces of the trench; reflowing a portion of the Co layer from the WF layer on the sidewall surfaces of the trench to the WF layer on the bottom surface of the trench by heating at 200° C. to 600° C.; partially oxidizing the Co layer remaining on the WF layer on the sidewall surfaces of the trench, above an upper surface of the reflowed Co and an upper surface of the reflowed Co layer; wet etching the oxidized Co layer and oxidized reflowed Co layer; etching the WF layer down to the upper surface of the reflowed Co layer, forming a cavity above the WF layer and reflowed Co layer; depositing a TiN barrier layer on sidewall and bottom surfaces of the cavity; and filling the cavity with W or Co to form a gate electrode. Additional aspects include forming a TiN barrier layer on the sidewall and bottom surfaces of the trench prior to depositing the Co layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of narrowing or pinching off metal gate layers attendant upon forming metal gate electrodes in a trench in an ILD. The decreased metal opening size can cause etching and recessing processes to fail and increase the likelihood of a gate electrode to contact short. To avoid or minimize the effect of narrowing or pinching off gate layers, a method in accordance with embodiments of the present disclosure includes forming a trench in an ILD on a substrate; forming a high-k dielectric layer and a WF layer sequentially on sidewall and bottom surfaces of the trench; forming a Co layer on the WF layer on the sidewall and bottom surfaces of the trench; reflowing a portion of the Co layer from the WF layer on the sidewall surfaces of the trench to the WF layer on the bottom surface of the trench; removing a remainder of the Co layer from the WF layer on the sidewall surfaces of the trench, above an upper surface of the reflowed Co; recessing the WF layer to the upper surface of the reflowed Co layer, forming a cavity above the reflowed Co layer; and filling the cavity with metal to form a gate electrode.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
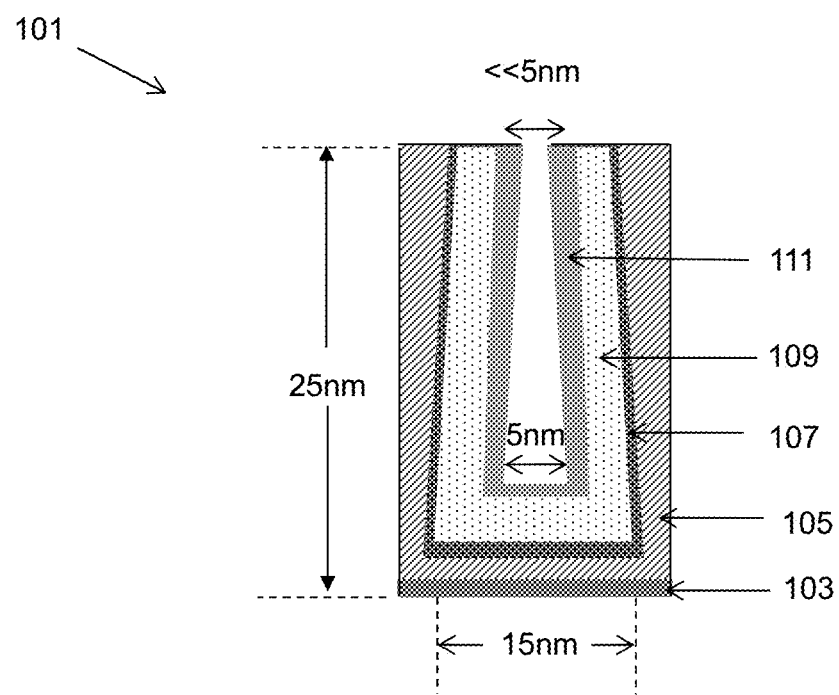
FIG. 1 illustrates a conventional gate for a gate electrode.
Figures 2A, 2B, 2C:
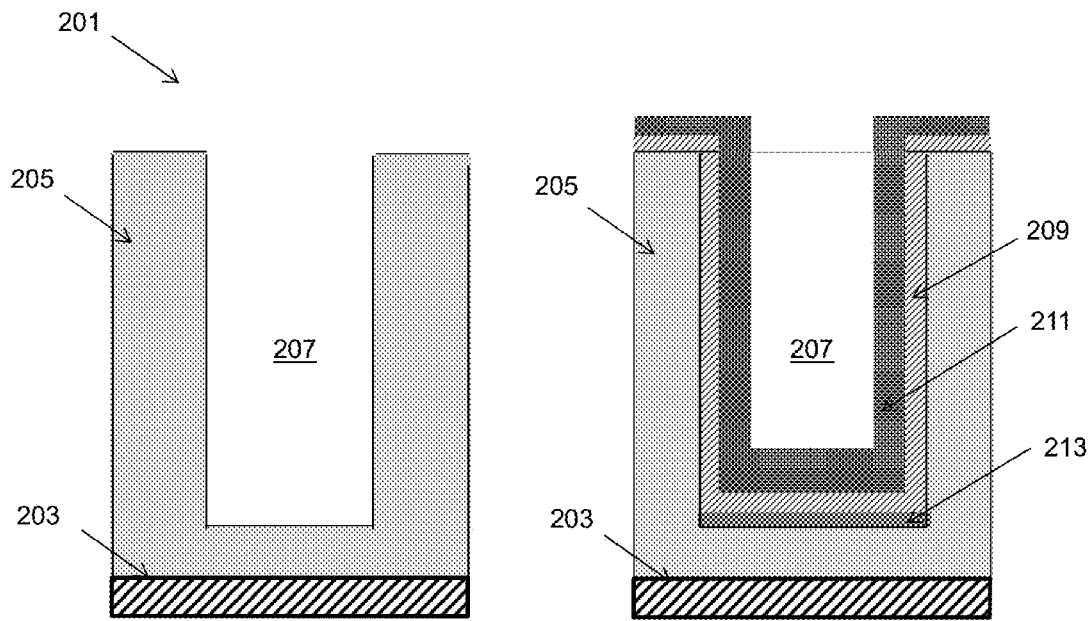
FIGS. 2A through 2G schematically illustrate a process flow for the formation of a Co layer by CVD for a semiconductor device according to an exemplary embodiment.

FIGS. 2A through 2G schematically illustrate a process flow for forming a semiconductor device 201 having a metal gate, according to an exemplary embodiment of the present disclosure. As depicted in FIG. 2A, device 201 includes a semiconductor substrate layer 203 and an ILD layer 205, in which a trench 207 is formed. As shown in FIG. 2B, a high-k dielectric layer 209 and a WF layer 211 are sequentially deposited on the top, sidewall and bottom surfaces of the trench 207 through an ALD process. The high-k dielectric layer 209 may be, for example, $HfO_2$, $ZrO_2$, $La_2O_3$, or $Y_2O_3$, and the like, and may be 0.5 nm to 3 nm, or 1 nm to 2 nm, or 1.5 nm thick. The WF layer 211 may be formed of a first layer of TiN and a second layer of TiAlC, for example, a 0.1 nm to 2 nm thick TiN layer, and a 2 nm to 6 nm thick TiAlC layer. Alternatively, the TiN layer, which acts as a barrier layer, may be omitted. The substrate 203 may also include a gate oxide layer 213, for example, silicon dioxide ($SiO_2$), on the substrate 203 under the high-k dielectric layer 209. In FIG. 2C, a Co layer 215 is formed on the sidewall and bottom surfaces of the trench 207, covering the WF layer 211. The Co layer 215 may be deposited on the sidewall and bottom surfaces of the trench 207 by CVD, and the Co layer 215 may be 2 to 3 nm thick. Post deposition annealing, e.g. at 400° C., may be performed to reduce the Co resistance.

Figures 2D, 2E:
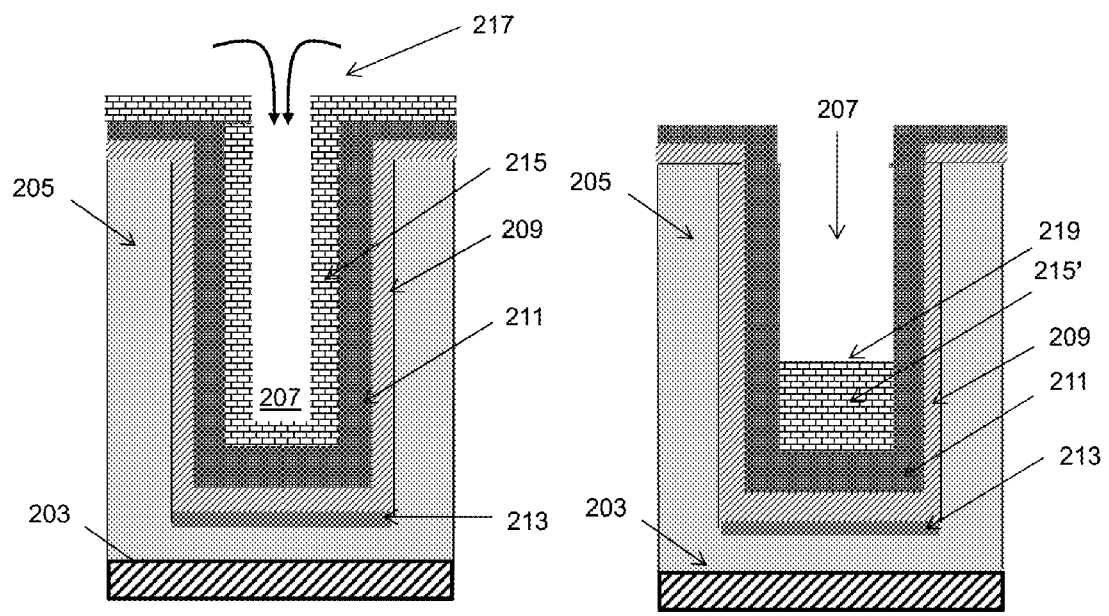
Figures 2F, 2G:
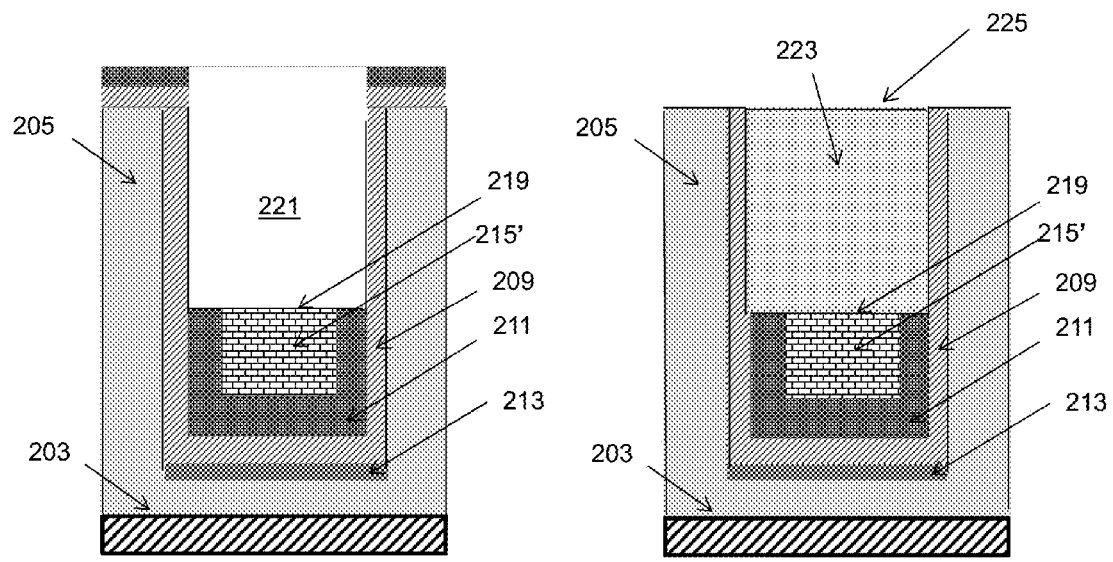

As illustrated in FIGS. 2D and 2E, a portion of the Co layer 215 is reflowed at 217 from the WF layer 211 on the sidewall surfaces of the trench 207 toward the WF layer 211 on the bottom surface of the trench 207. The Co layer 215 may be reflowed by heating the layer at 200° C. to 600° C. Any remaining Co on the WF layer 211 is then removed above the upper surface 219 of the reflowed Co layer 215', for example, by oxidizing the Co layer 215 and removing the oxidized Co by wet etching. Partial or complete oxidation of the Co layer 215 may occur through native oxidation or by subjecting the Co layer to an oxidizing agent. The oxidized Co layer 215 may be removed by wet etching (for example with 3000:1 HF at 25° C. and 10000:1 citric acid at 25° C., which produces controllable consistent etch rates at 11-12 A/min, or with 1000:1 $NH_4OH$ at 25° C. and 1000:1 TEAH at 60° C.), which potentially only removes the top thin layer (Co oxide layer) of the Co layer. As shown in FIG. 2F, the WF layer 211 is then recessed to the upper surface 219 of the reflowed Co layer 215' by etching, forming a cavity 221 above the reflowed Co layer 215'. As shown in FIG. 2G, the cavity 221 is filled with metal 223 to complete the gate electrode 225. The cavity 221 may, for example, be filled by depositing a TiN barrier layer to a thickness of 1 to 9 angstroms (Å) on the sidewall and bottom surfaces, followed by depositing a W seed layer on the TiN barrier layer by ALD and filling the remainder of the cavity with W by CVD, or the cavity 221 may be filled with Co by CVD after after depositing a TiN barrier layer to a thickness of 0.5 nm to 10 nm. The metal in the cavity may then be planarized by CMP. Conventional processing (not shown for illustrative convenience) may then proceed, such as recessing and forming a self-aligned cap.

The embodiments of the present disclosure can achieve several technical effects, such as eliminating narrowing or pinching off WF metal during formation of a gate electrode, thereby eliminating gate to contact shorts, and also decreasing resistivity of the gate (less than 50 micro-ohms per centimeter for CVD Co versus greater than 400 micro-ohms per centimeter for ALD TiN). Devices formed in accordance with embodiments of the present disclosure are useful in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any of various types of highly integrated semiconductor devices, particularly for the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a trench in an interlayer dielectric (ILD) on a substrate;
   forming a high-k dielectric layer and a work function (WF) layer sequentially on sidewall and bottom surfaces of the trench;
   forming a cobalt (Co) layer on the WF layer on the sidewall and bottom surfaces of the trench;
   reflowing a portion of the Co layer from the WF layer on the sidewall surfaces of the trench to the WF layer on the bottom surface of the trench;
   removing a remainder of the Co layer from the WF layer on the sidewall surfaces of the trench, above an upper surface of the reflowed Co layer;
   recessing the WF layer to the upper surface of the reflowed Co layer, forming a cavity above the reflowed Co layer; and
   filling the cavity with metal to form a gate electrode.

2. The method according to claim 1, comprising forming the Co layer by chemical vapor deposition (CVD).

3. The method according to claim 1, comprising reflowing the Co layer from the WF layer on the sidewall surfaces of the trench to the bottom surface of the trench by heating the Co layer at 200° C. to 600° C.

4. The method according to claim 1, further comprising removing the remainder of the Co layer from the WF layer on the sidewall surfaces of the trench by oxidizing the remainder of the Co layer and removing the oxidized Co layer and any remaining Co of the Co layer on the WF layer on the sidewall surfaces of the trench.

5. The method according to claim 4, comprising removing the oxidized Co layer and remaining Co from the WF layer on the sidewall surfaces of the trench by wet etching.

6. The method according to claim 1, comprising recessing the WF layer to the upper surface of the reflowed Co layer by etching.

7. The method according to claim 1, wherein filling the cavity with metal to form a gate electrode comprises forming a titanium nitride (TiN) barrier layer on sidewall and bottom surfaces of the cavity.

8. The method according to claim 7, wherein filling the cavity with metal to form a gate electrode further comprises depositing a tungsten (W) seed layer on the TiN barrier layer by atomic layer deposition (ALD) and filling a remainder of the cavity with W by CVD.

9. The method according to claim 7, wherein filling the cavity with metal to form a gate electrode further comprises filling a remainder of the cavity with Co by CVD after forming the TiN barrier layer.

10. The method according to claim 1, further comprising forming a gate oxide layer on the bottom surface of the trench prior to forming the high-k dielectric layer.

11. The method according to claim 1, wherein the forming the WF layer comprises forming a first layer of TiN and a second layer of titanium aluminum carbide (TiAlC).

12. The method according to claim 1, further comprising chemical-mechanical polishing (CMP) the metal after filling the cavity.

13. A device comprising:
    a first trench formed in an interlayer dielectric (ILD);
    a high-k dielectric layer on top, sidewall and bottom surfaces of the first trench;
    a work function (WF) layer on the high-k dielectric layer on the bottom surface and a bottom portion of the sidewall surfaces of the first trench,
    a second trench formed by providing the WF layer on both the high-k dielectric layer and a bottom portion of the sidewall surfaces of the first trench;
    a Co layer filling the second trench;
    a metal filling a remainder of the first trench; and
    a gate oxide layer on the bottom surface of the first trench, under the high-k dielectric layer.

14. The device according to claim 13, wherein the WF layer comprises TiN and TiAlC.

15. The device according to claim 13, wherein the metal comprises a TiN barrier layer on sidewall and bottom surfaces of the remainder of the first trench.

16. The device according to claim 15, wherein the metal further comprises W or Co filling the remainder of the first trench.

17. The device according to claim 13, further comprising a TiN barrier layer on side and bottom surfaces of second trench, under the Co layer.

18. A method comprising:
    forming a trench in an interlayer dielectric (ILD) on a substrate;
    forming a high-k dielectric layer and a work function (WF) layer sequentially on sidewall and bottom surfaces of the first trench;
    chemical vapor depositing a Co layer on the WF layer on the sidewall and bottom surfaces of the trench;
    reflowing a portion of the Co layer from the WF layer on the sidewall surfaces of the trench to the WF layer on the bottom surface of the trench by heating at 200° C. to 600° C.;
    oxidizing the Co layer remaining on the WF layer on the sidewall surfaces of the trench above an upper surface of the reflowed Co layer;
    wet etching the oxidized Co layer;
    etching the WF layer down to the upper surface of the reflowed Co layer, forming a cavity above the WF layer and reflowed Co layer;

depositing a TiN barrier layer on sidewall and bottom surfaces of the cavity; and filling the cavity with W or Co to form a gate electrode.

19. The method according to claim 18, further comprising forming a TiN barrier layer on the sidewall and bottom surfaces of the trench prior to chemical vapor depositing the Co layer.

* * * * *